United States Patent [19]

Kaneshima

[11] Patent Number: 5,737,585
[45] Date of Patent: Apr. 7, 1998

[54] FIRMWARE MAINTENANCE AND MODIFICATION SYSTEM

[75] Inventor: Toshihito Kaneshima, Kawasaki, Japan

[73] Assignee: Fujitsu Limited, Kawasaki, Japan

[21] Appl. No.: 734,313

[22] Filed: Oct. 21, 1996

Related U.S. Application Data

[63] Continuation of Ser. No. 264,486, Jun. 23, 1994, abandoned.

[30] Foreign Application Priority Data

Jan. 10, 1994 [JP] Japan .................................. 6-013242

[51] Int. Cl.$^6$ ............................................. G06F 9/455
[52] U.S. Cl. ...................... 395/500; 395/416; 395/430; 364/243; 364/244
[58] Field of Search ............................. 395/400, 500, 395/700

[56] References Cited

U.S. PATENT DOCUMENTS

| | | | |
|---|---|---|---|
| 4,868,738 | 9/1989 | Kish et al. | 364/200 |
| 4,914,577 | 4/1990 | Stewart et al. | 364/200 |
| 5,091,846 | 2/1992 | Sachs et al. | 395/250 |
| 5,117,491 | 5/1992 | Ledoux et al. | 395/375 |
| 5,210,854 | 5/1993 | Beaverton | 395/500 |
| 5,278,961 | 1/1994 | Muller | 395/400 |
| 5,301,328 | 4/1994 | Begur et al. | 395/700 |
| 5,313,582 | 5/1994 | Hendel et al. | 395/250 |
| 5,347,643 | 9/1994 | Kondo et al. | 395/425 |
| 5,390,310 | 2/1995 | Welland | 395/400 |

FOREIGN PATENT DOCUMENTS

| | | |
|---|---|---|
| 58-54455 | 3/1983 | Japan . |
| 64-32338 | 2/1989 | Japan . |
| 2-5167 | 1/1990 | Japan . |

Primary Examiner—Lucien U. Toplu
Assistant Examiner—Majid A. Banankhah
Attorney, Agent, or Firm—Staas & Halsey

[57] ABSTRACT

The present invention relates to a firmware maintenance system, which reduces the size of the hardware and increases reliability. The firmware maintenance system maintains a station to be maintained having firmware, from a remote location. The system has a microcomputer in the station to be maintained; a non-volatile memory which includes an area for storing the firmware and managing the storing location; and a memory management unit for converting the logical address of the microcomputer and the physical (real) address of the non-volatile memory. The memory management unit transfers the firmware required to be updated as an undivided whole to the station to be maintained from the remote location, and updates and stores the transferred firmware in the non-volatile memory.

10 Claims, 13 Drawing Sheets

FIRMWARE MAINTENANCE AND MODIFICATION SYSTEM

This application is a continuation of application Ser. No. 08/264,486, filed Jun. 23, 1994, now abandoned.

The present invention relates to a firmware maintenance system. More particularly, it relates to a firmware maintenance system for modifying and maintaining the firmware provided on an appropriate system, based on the firmware.

In a communication system which connects and locates multiple subordinate devices around a central monitoring system, the operation of which is managed based on firmware via the communication network, cases exist where the firmware in the multiple subordinate devices has to be modified and maintained. This case may occur due to the modification of the processing contents or the modification of the system configuration and the like.

In this case, it is desired that modification and maintenance of the firmware be performed effectively. Consequently, a system is provided with an external storage medium, for the subordinate devices, for writing and modifying the program required to be modified to this external storage medium.

The present invention proposes that a non-volatile memory of EEPROM and the like is provided to subordinate devices which are the stations to be maintained, in the prior Japanese Patent Application No. 5167/1990 (Tokkai hei 2-5167), to solve the problem existing in the above system.

BACKGROUND OF THE INVENTION

Figure 13:
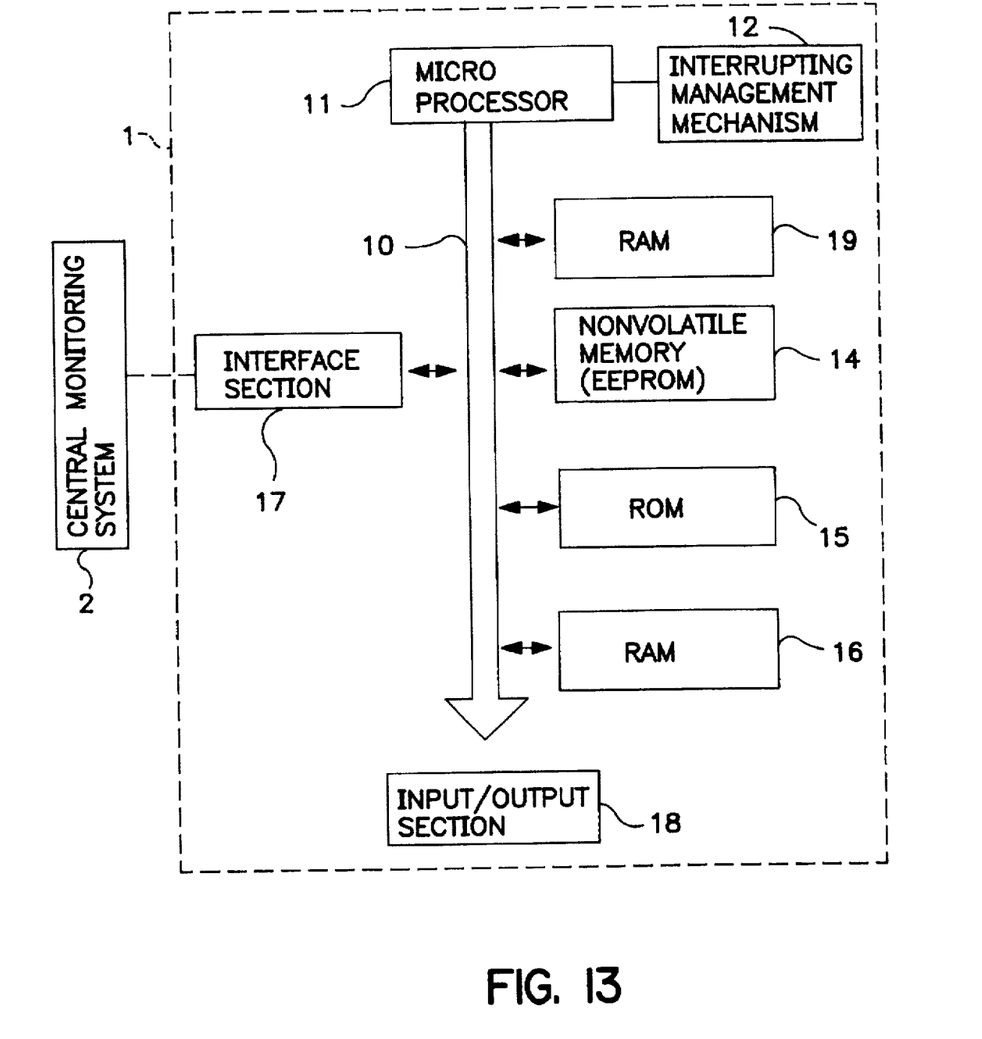
FIG. 13 is a block diagram explaining the function of a conventional system.

FIG. 13 is a functional block diagram of a conventional station 1 to be maintained, in which the firmware maintenance system is employed using a non-volatile memory of EEPROM and the like, and proposed in the above-described patent application No. 5167/1990 (Tokkai hei 2-5167).

The station to be maintained 1 has a common bus 10 which is connected to a microprocessor 11. Additionally, a non-volatile memory (EEPROM) 14; a ROM 15 for storing a program for set-up operation; a RAM 16 for program operation; an interface section 17 with a remote maintenance system 2; a peripheral input/output section 18; and a RAM 19 for storing in the time for operating the program and the like, are connected to this common bus 10.

An interrupting management mechanism 12 and such are also connected to the microprocessor 11. In this structure, the modify command defined for the program modification is sent from the base station of the central monitoring system 2 for maintaining the multiple stations to be maintained with the modified data, according to the invention disclosed in the prior patent application as mentioned above.

The interface section 17 of the station 1 to be maintained receives this modified data, and stores the data as the program data performed version up to the non-volatile memory 14, under management of the microprocessor 11.

A operation shown in FIG. 13 will now be explained. The BIOS program or the like, for setting up the function of the system, is stored in the ROM 15. This BIOS program is required for performing the operation of copying the program stored in the non-volatile memory 14, as firmware, to the address space where the program can be operated. This address space for the operation is allocated to the RAM 19.

Accordingly, it is required that the program stored in the non-volatile memory 14 is copied to the RAM 19 once.

As described above, in the conventional system, the RAM 19 for operation is required to operate the program stored as firmware in the non-volatile memory 14. As a result, the size of the hardware in the station becomes larger.

Further, the conventional system does not have a protect function for the memory (the function of setting the write protect area with software), since it does not have means for managing the memory. Thus, breakdown of the data of the firmware stored in the non-volatile memory 14 is possible when a runaway condition occurs due to operation error of the firmware. In this case, the system can not be restarted.

SUMMARY OF THE INVENTION

Accordingly, it is an object of the present invention to exclude the memory for program operation (RAM 19 shown in FIG. 13) required in the case where the firmware is operated, and reduce the size of the hardware. It is a further object of the present invention to prevent the system from being unable to restart due to breakdown of the non-volatile memory when a runaway of the firmware or when the limit of write frequency of the non-volatile memory is exceeded, and thereby improve the reliability of the system.

DESCRIPTION OF THE PREFERRED EMBODIMENT

Figure 1:
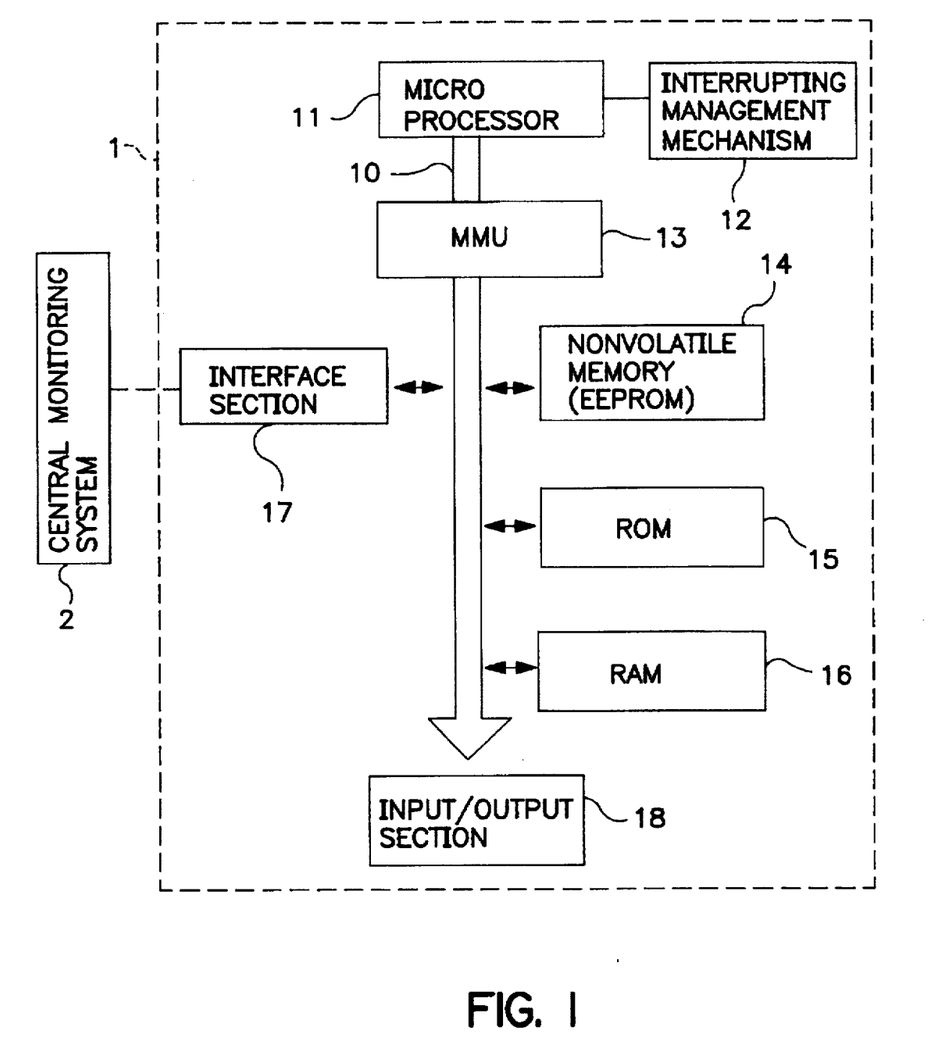
FIG. 1 is a diagram explaining the principle of the present invention.

FIG. 1 is the principle diagram of the station to be maintained of the present invention. The station to be maintained has a non-volatile memory 14 which has firmware, and a memory management unit (MMU) 13 for managing the contents stored in this non-volatile memory 14, as a basic structure.

The memory management unit (MMU) 13 is a logical element having a converting function which converts between an address (logical address) handled according to the program by CPU and a real memory address (physical address). Further, runaway of the program or the damage of the system can be held to a minimum by mapping only the page required for writing to the logical space of the CPU, when writing to the non-volatile memory 14 for converting.

The maintenance system transfers the firmware required to be updated as an undivided whole, from the remote location to the station to be maintained 1, and further, updates and stores the transferred firmware to the non-volatile memory 14.

Accordingly, in comparison to the structure of the conventional system shown in FIG. 13, the present invention has a feature of the memory management unit 13. Therefore, the RAM 19 for reading the program from the non-volatile memory 14 is excluded.

Firmware of multiple different versions are stored in the non-volatile memory 14. Each version of the multiple firmware is managed when the multiple different versions are stored.

By the above-described structure, each version stored in the non-volatile memory 14 and the operational or non-operational condition of the version are detected and the firmware desired to be started is determined, when the firmware is initially started. This function is performed by the management of the microcomputer 11.

A real address which is an address on the non-volatile memory 14, and a logical address for firmware operation are set up so that the firmware can be operated for the memory management unit 13 by the microprocessor 11. When the setting is completed, processing of the firmware in the set address is performed.

Further, the memory can be prevented from breaking down in the case of a runaway program or the case of operation error, by providing a write-protect attribute when the logic address for the firmware operation is set for the memory management unit 13.

Figure 2:
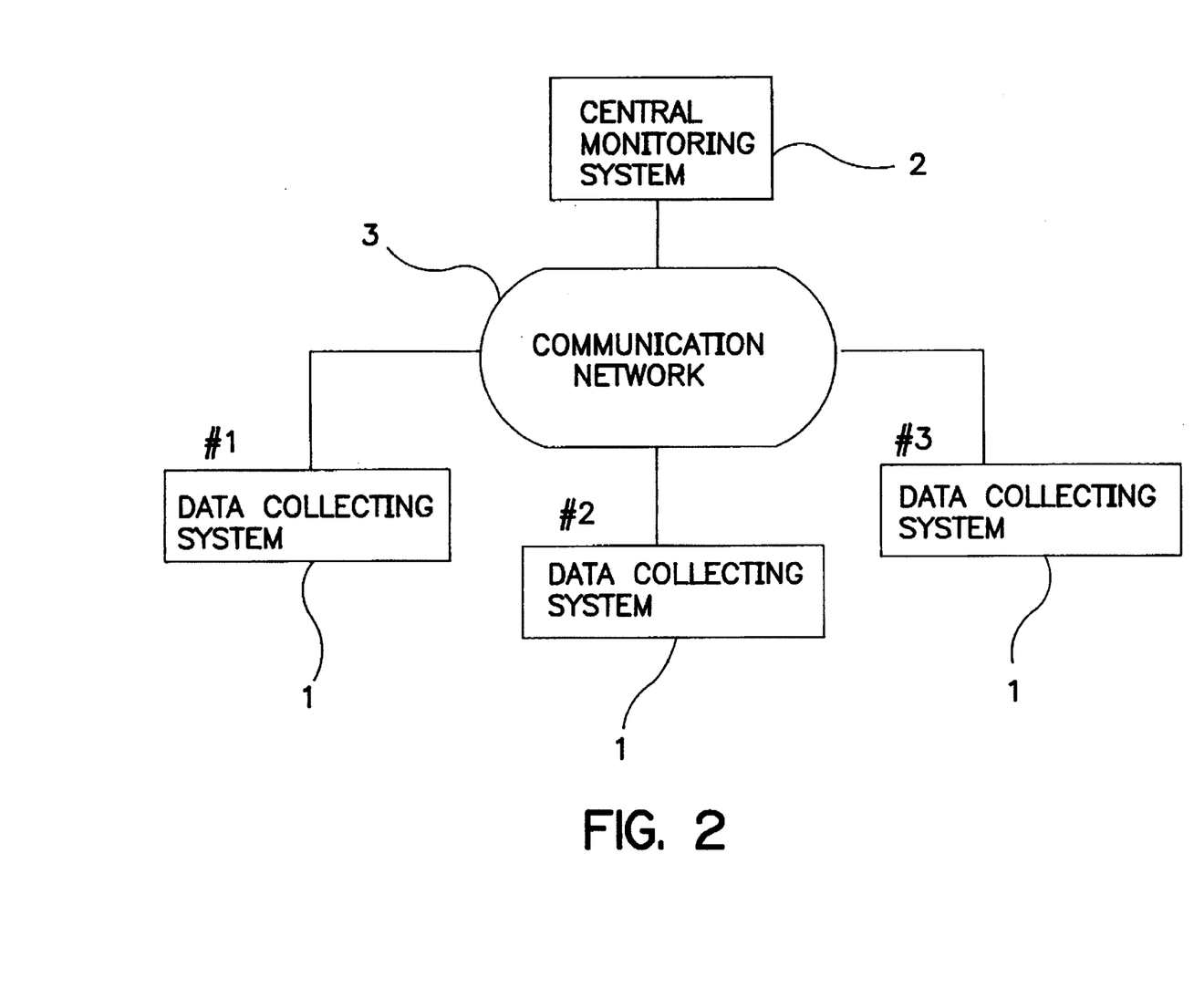
FIG. 2 is a system example applied to the present invention.

FIG. 2 shows a system example for data collection embodying the present invention. The system shown in FIG. 2 has a structure such that the data collecting devices (#1–#3) 1 of multiple unattended stations located in the remote location are connected to the central monitoring system 2 via a communication network 3. In this system, the firmware of the data collecting device 1 is maintained as an undivided whole by the central monitoring system 2.

Figure 3:
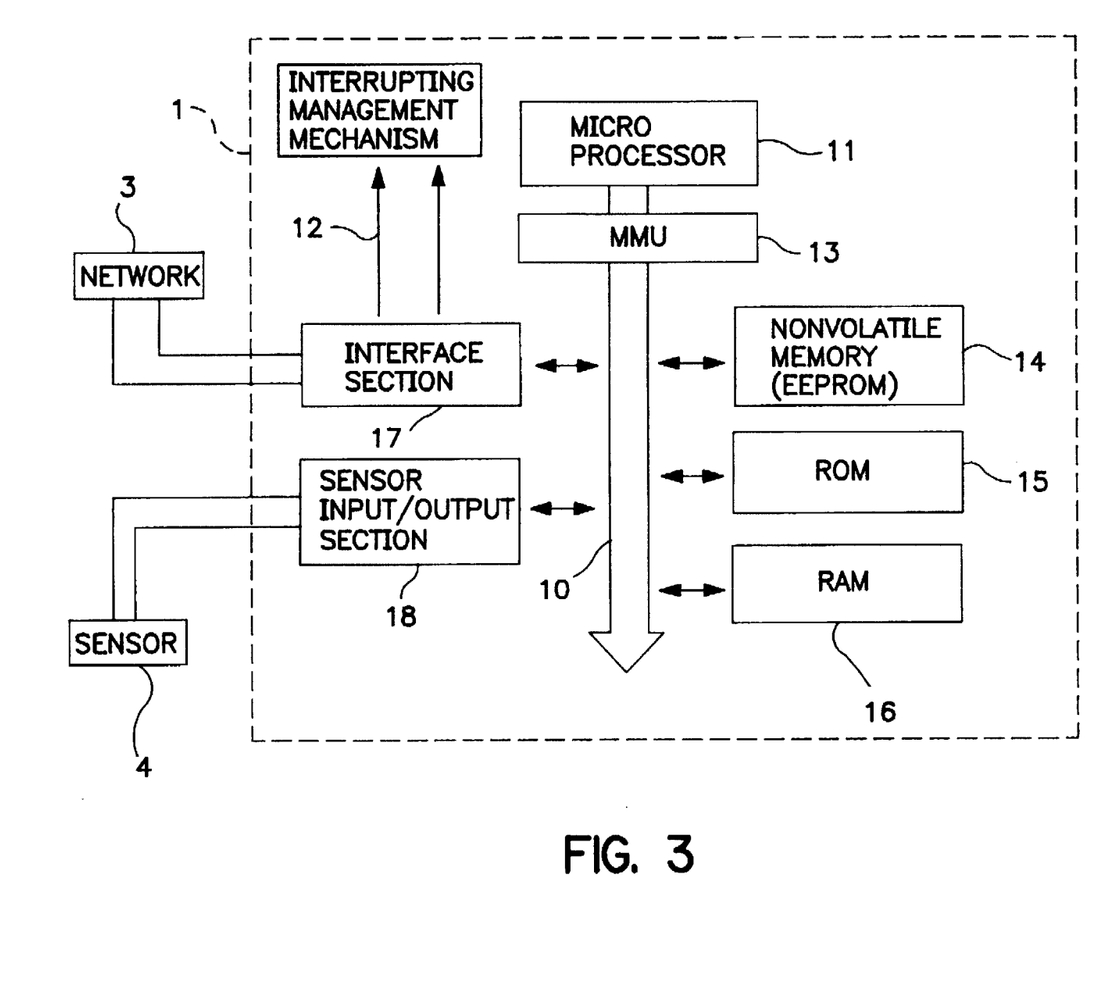
FIG. 3 is a functional block diagram showing the embodiment of the present invention.

FIG. 3 is a functional block diagram showing the embodiment of the above-described data collecting device 1. The basic structure is the same as described in the principle diagram of FIG. 1. In FIG. 3, an interface section 17 is connected to the central monitoring system 2 via the network 3.

The station to be maintained 1 has a sensor input/output section 18 as a peripheral input/output function, which receives detected data from the sensor 4 for sensing the temperature, the humidity and the like, and transfers the detected data to the memory 16 for program operation via the common bus 10. The detected data transferred to the memory 16 for program operation is processed based on the firmware program stored in the non-volatile memory 14 under the management of the microprocessor 11.

An EEPROM is used as the non-volatile memory 14 in this embodiment. An EEPROM is a storing element which can modify the data electrically and which is non-volatile. The contents of the are not lost even if power is not supplied.

The microprocessor 11 has logic addresses (00000–7FFFF) for each memory. The address from the microprocessor 11 is converted to a corresponding physical (real) address by the memory management unit (MMU) 13 and accessed for each memory. The real address of each memory is also converted to the corresponding logical address of the address space managed by the microprocessor 11.

Although the conversion rule is different depending on the memory management unit (MMU) 13, addresses are converted by one block unit (hereinafter referred to as a "page"). In the embodiment of the present invention, 4K bits contribute a unit of one block. In addition, a conversion table 50 for converting is pre-stored in the memory management unit (MMU) 13.

Figure 4:
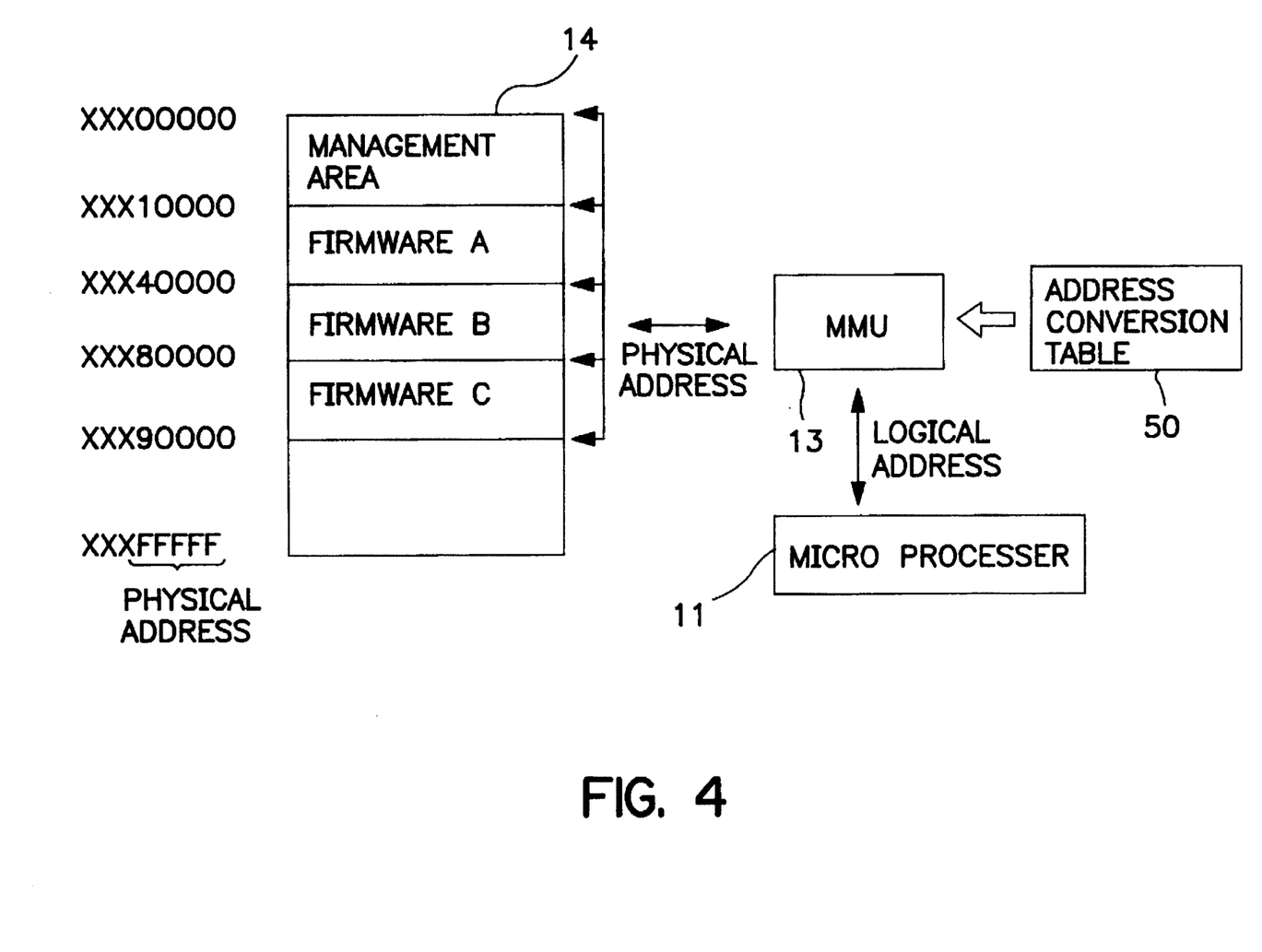
FIG. 4 is a diagram showing the relation of the address conversion in the present invention.

FIG. 4 shows the relation between the logical addresses and the physical (real) addresses. As shown in FIG. 4, the logical addresses (00000–7FFFF) are transferred between the microprocessor 11 and the memory management unit (MMU) 13.

Logical addresses (00000–7FFFF) are converted to physical (real) addresses by the memory management unit (MMU) 13, based on the address conversion table 50. Additionally, the physical (real) addresses are converted to the logical addresses (00000–7FFFF).

The example shown in FIG. 4 illustrates that corresponding addresses in the logical addresses (00000–7FFFF) correspond and are converted to real addresses (XXX00000–XXXFFFFFF) and then stored in the non-volatile memory 14.

Figure 5:
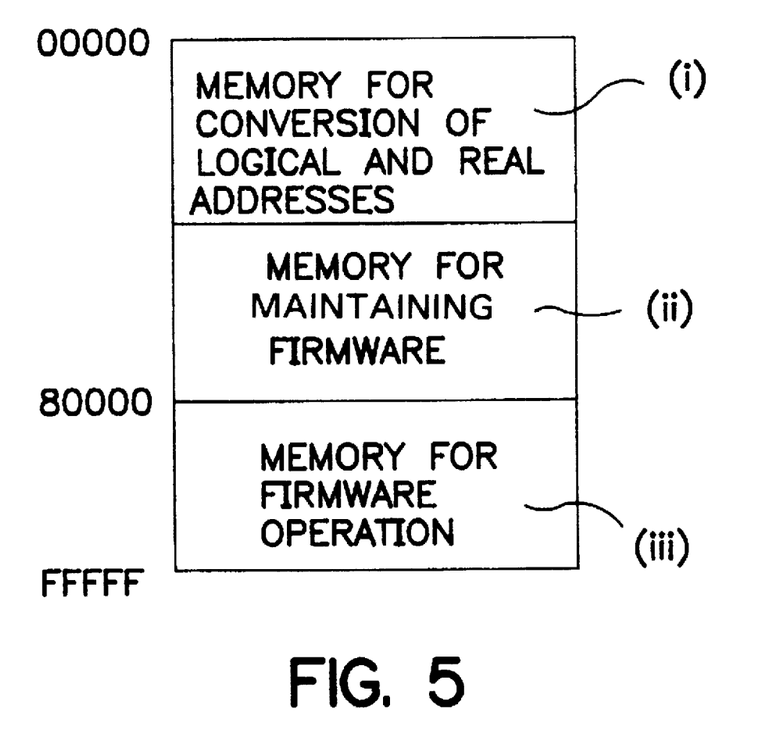
FIG. 5 is a diagram showing the example of the logical address space viewed from the microprocessor.

FIG. 5 is an example of the logical address space viewed from the microprocessor 11. FIG. 5 shows the logical address space structured such that the physical (real) addresses are converted by the memory management unit 13. Further, FIG. 5 shows the addresses where the real firmware is operated.

In FIG. 5, FIG. 5(i) represents address space for performing conversion of the logical address and real address. Further, FIG. 5(ii) represents an area for mapping, as required, when the firmware is maintained, i.e., the firmware is written to the non-volatile memory 14. Furthermore, FIG. 5(iii) represents memory space allocated to the memory 16 for program operation.

Figure 6:
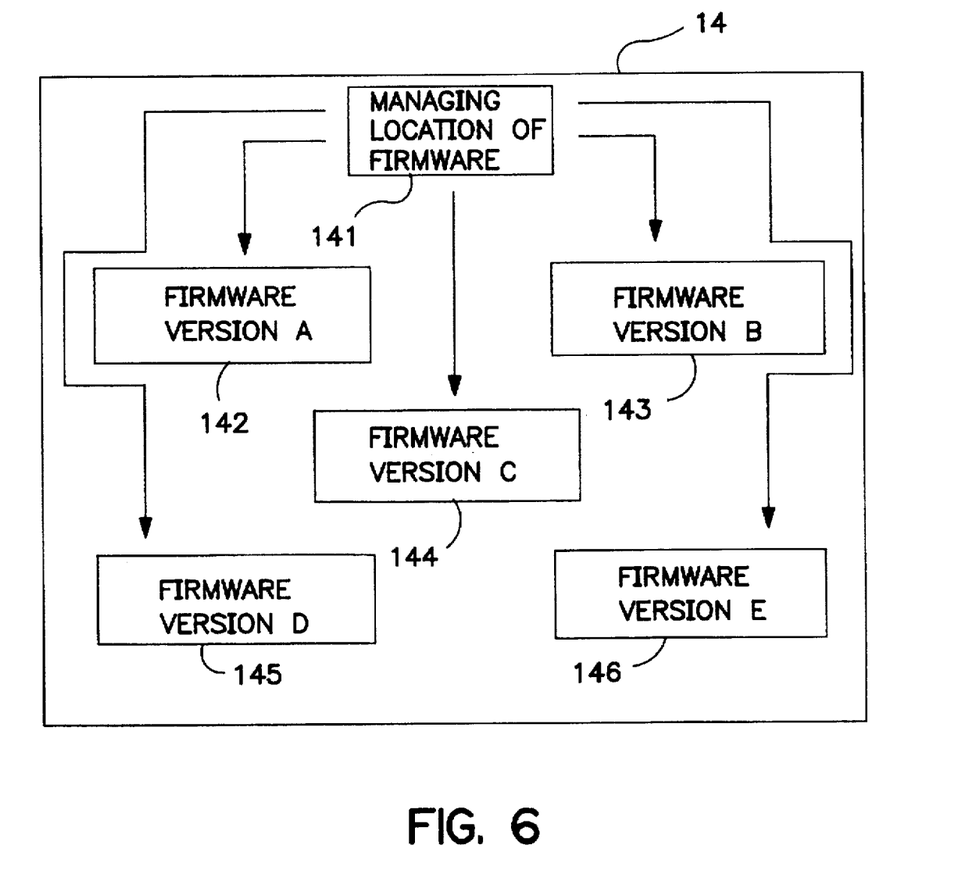
FIG. 6 is a diagram explaining the location image in the non-volatile memory.

The location of the firmware stored in the non-volatile memory 14 will now be considered. FIG. 6 is a diagram for showing the location of the firmware stored in the non-volatile memory 14. The non-volatile memory 14 has an area 141 for managing the storing location of the firmware, and multiple areas 142–146 for storing multiple versions A–E of the firmware.

As shown in FIG. 4, the area 141 for managing the storing locations of the firmware is allocated to an address space of the real addresses XXX00000–XXX10000 stored in the non-volatile memory 14. The firmware of version A is allocated to an address space of XXX10000–XXX40000, the firmware of version B is allocated to an address space of XXX40000–XXX80000, and the firmware of version C is allocated to an address space of XXX80000–XXX90000, etc., for example.

Figure 7:
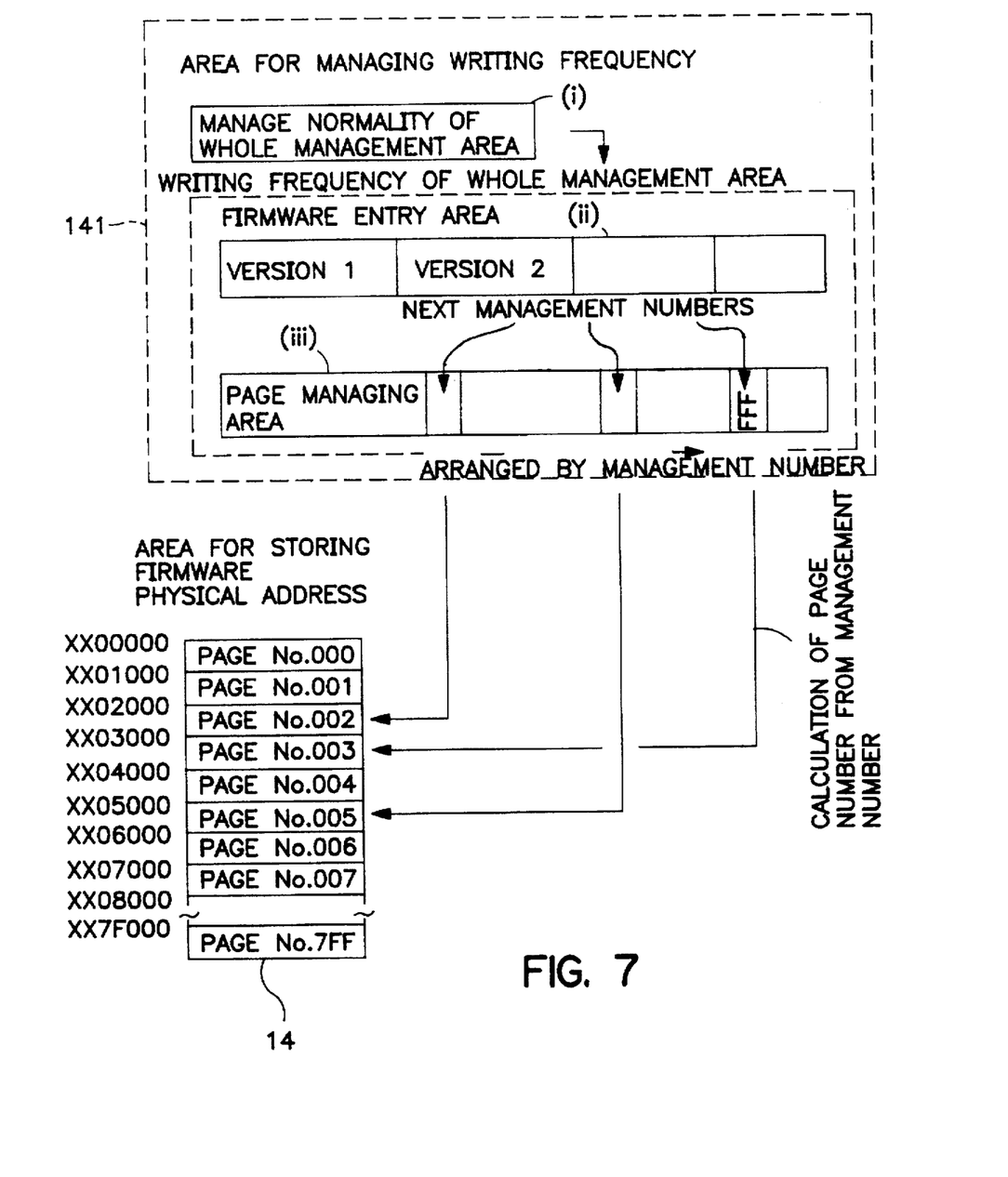
FIG. 7 is a diagram explaining the firmware management configuration in the non-volatile memory.
Figure 8:
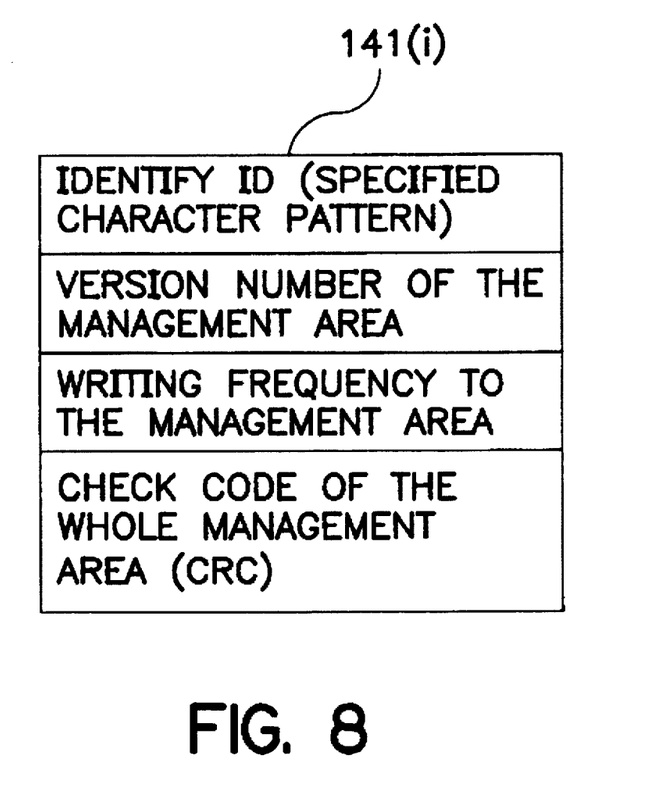
FIG. 8 is a diagram explaining the detail of area for managing the writing frequency of the management area in the non-volatile memory.
Figure 9:
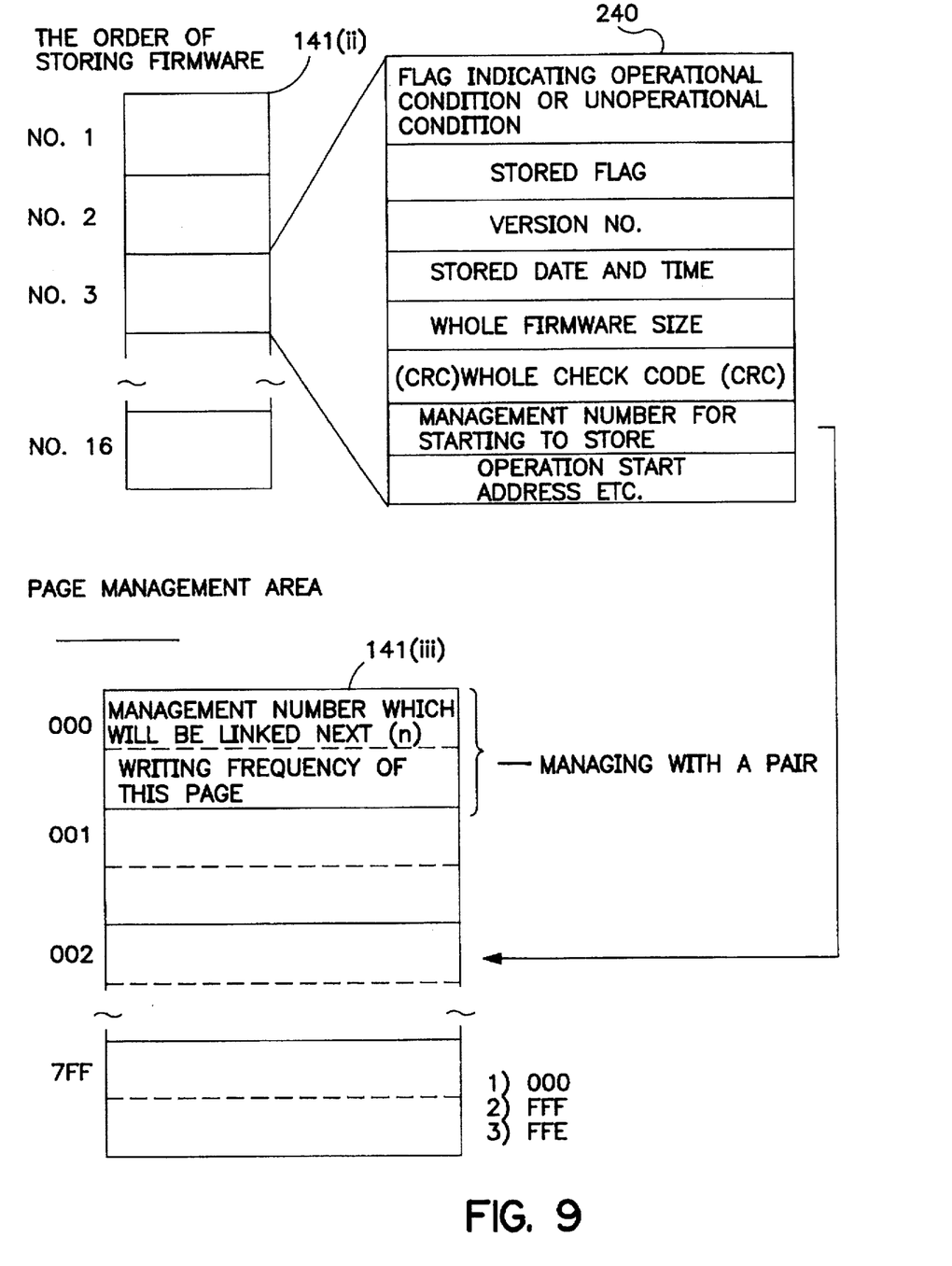
FIG. 9 is a diagram explaining the detail of the firmware entry area of the firmware management area in the non-volatile memory.

FIG. 7 shows the management configuration of the area 141 for managing the storing location of the firmware stored in the non-volatile memory 14, as the feature of the present invention. Further, FIGS. 8 and 9 are diagrams explaining the details of this management configuration.

FIG. 7 shows the whole image of the page management for managing the firmware of each version, etc. As shown in FIG. 7, the firmware required to be stored is managed by three areas of 141: (i), (ii) and (iii).

141(i) is an area for managing the write frequency, which manages the location of the whole area for the managing page (the judgment whether it is used), and the normality (the judgment whether the area is correct). More specifically, the non-volatile memory usually has the limit of the write frequency because of characteristics of the device.

Thus, when the management area 141 is provided in the non-volatile memory 14, the write frequency for this area naturally becomes larger. The management of the write frequency of the whole management area and of the start position of the management area is performed in this area itself, to prevent the problem of the write frequency becoming larger.

More specifically, the management area 141(i) is recorded with an identification ID, a version number of the management area, a writing frequency of the management area, and a check code (CRC) of the whole management area, as shown in FIG. 8.

The starting position of the management area is determined in the processing flow (FIG. 10) when the CPU is reset, as explained later. Accordingly, the management area 141 shown in FIG. 6 may exist anywhere within the non-volatile memory.

The firmware entry area of 141(ii) manages the version number of the firmware and the stored starting page number stored in the non-volatile memory 14, as shown in detail in FIG. 9 (shown by reference number 240). This firmware entry area is referred to when the firmware required to be operated is being determined during processing when the CPU is reset.

Further, the front page number at which the firmware is stored in the page management area 141(iii) is also shown in FIG. 9 ("the management number for starting storing" of the area shown by reference numeral 240).

The page management area of 141(iii) manages the condition for using the non-volatile memory 14 in the unit for mapping to the memory management unit (MMU) 13 and the storing location of the divided firmware together. At the same time, the write frequency of the appropriate page is also managed.

The system for management is one for giving the serial page number for using the non-volatile memory 14 as the block of one unit. Accordingly, the following page number is shown in the page management area, as shown in 141(iii), in the case where the firmware cannot be stored in one page (see FIG. 9).

One example is where the next page number is "FFF" indicating the finish page (which has no following page) and the number is "000" indicating that the page is unused (idle page).

Further, this page management area also stores the write frequency. The page management area is managed to perform writing in the page which has a small write frequency, when it is stored. When the page exceeds the limit of the write frequency, the page number is marked "FFE" and, consequently, the page is managed as a permanent unused area (see FIG. 9).

In FIG. 7, the management number in the page management area 141(iii) corresponds to the page of the area for storing firmware in the non-volatile memory 14, by calculation. Further, as described above, one page is shown with 4 bits as the embodiment of the present invention. Accordingly, in the case where the maximum value of the management number is 2048 (800 HEX), the area having a maximum 8MB may be managed (4 bites×2048=8192 bites).

Figure 10:
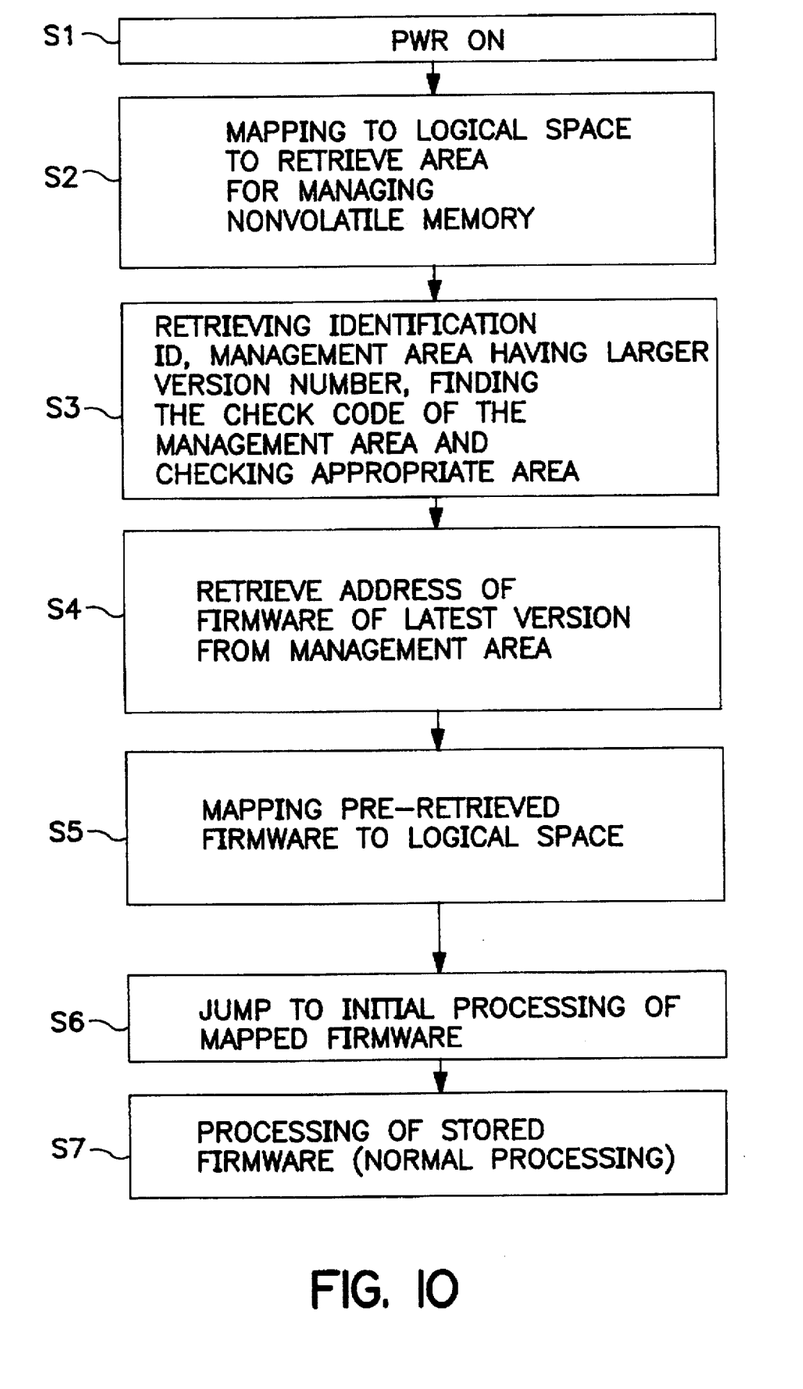
FIG. 10 is a diagram explaining the processing flow when resetting CPU.

The operation of the embodiment will be explained according to the processing flow when the CPU is reset, as shown in FIG. 10.

When the system is reset to POWER ON (STEP S1), the memory management unit (MMU) 13 is initially set. In addition, the real address stored in the non-volatile memory 14 is converted and mapped to the logical address space by the memory management unit (MMU) 13, to retrieve the management area 141 stored in the non-volatile memory 14 (STEP S2).

Then, the identification ID (see FIG. 8) of the area 141(i), for managing the write frequency, is retrieved to find the latest management area. During this time, the identification ID having the larger version number is retrieved. Additionally, the check code (CRC) of the management area is found and the normality of the appropriate area is checked (STEP S3).

Further, the address of the latest version of the firmware is retrieved from the information (see FIG. 9, 240) stored in the firmware entry area 141(ii) (STEP S4). The retrieved firmware is then mapped to the logical address space. When mapping, the firmware sets the memory management unit (MMU) 13 as the write protect area (STEP S5).

After that, initialization of the mapped firmware is performed based on the information stored in the firmware entry area (see FIG. 9, 240) (STEP S6). Next, the processing (which is normal processing) of the stored firmware is performed (STEP S7).

The process for resetting in response to a POWER ON, and the processing of each management table have been explained as mentioned above.

Figure 11:
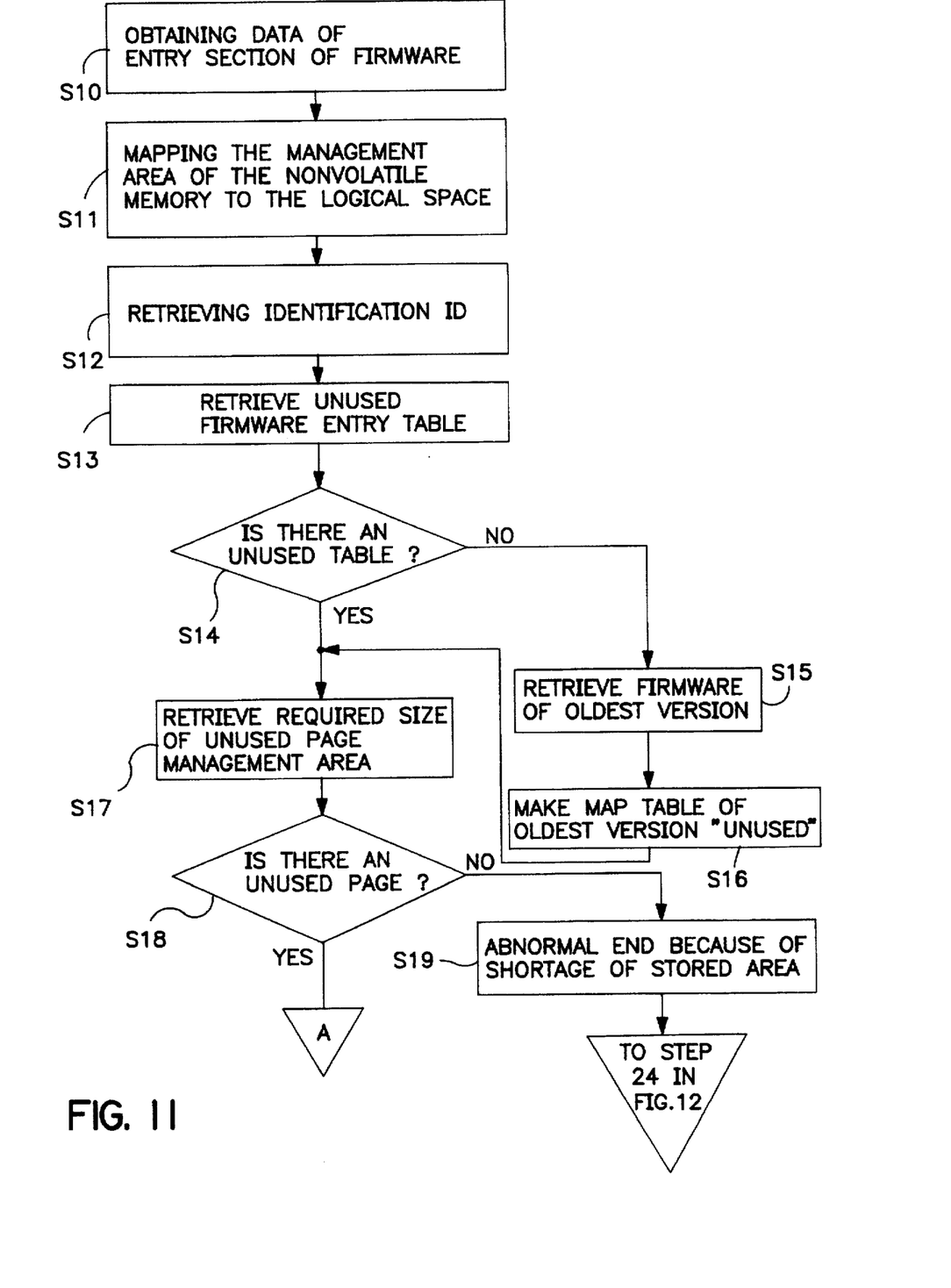
FIG. 11 is a first part of a diagram explaining the processing flow when writing to the non-volatile memory.

The processing when the firmware is written to the non-volatile memory 14 will now be explained, referring to FIGS. 11 and 12, as follows.

The firmware maintenance command is sent from the central monitoring system 2 which is located at the remote location under the normal operation. The information which is to be stored in the entry table, relating to the firmware which is to be written, is obtained from the received maintenance command in the interface section 17 with the central monitoring system (STEP S10).

The real address stored in the non-volatile memory 14 is mapped to the logical address space to operate the management area 141 in the non-volatile memory 14 (STEP S11). Then the management area 141 in the non-volatile memory 14 is retrieved based on the identification ID (see FIG. 8) (STEP S12).

The unused firmware entry table is next retrieved by the firmware entry area 141(ii) (see FIG. 9) and its existence confirmed (STEP S14). When the unused table is not found, the oldest version of the firmware is retrieved (STEP S15). All of the map tables of the firmware of the oldest version which is retrieved in STEP S15 are indicated as being unused (STEP S16).

When the unused table is retrieved in STEP S14, and all of the map tables of the oldest version of the firmware are indicated as being unused in STEP S16, i.e., the case where the firmware of the old version is deleted, the required size is retrieved from the page management area (see FIG. 9, 141(iii)) based on the size of the firmware stored at this time (STEP S17).

The existence of the unused page is next determined (STEP S18). In the case where the unused page is not found, it has an abnormal end because of the shortage of the stored area (STEP S19) and, therefore, the firmware entry area (141(ii)) is updated and the processing is finished (see FIG. 12, STEP S24).

Figure 12:
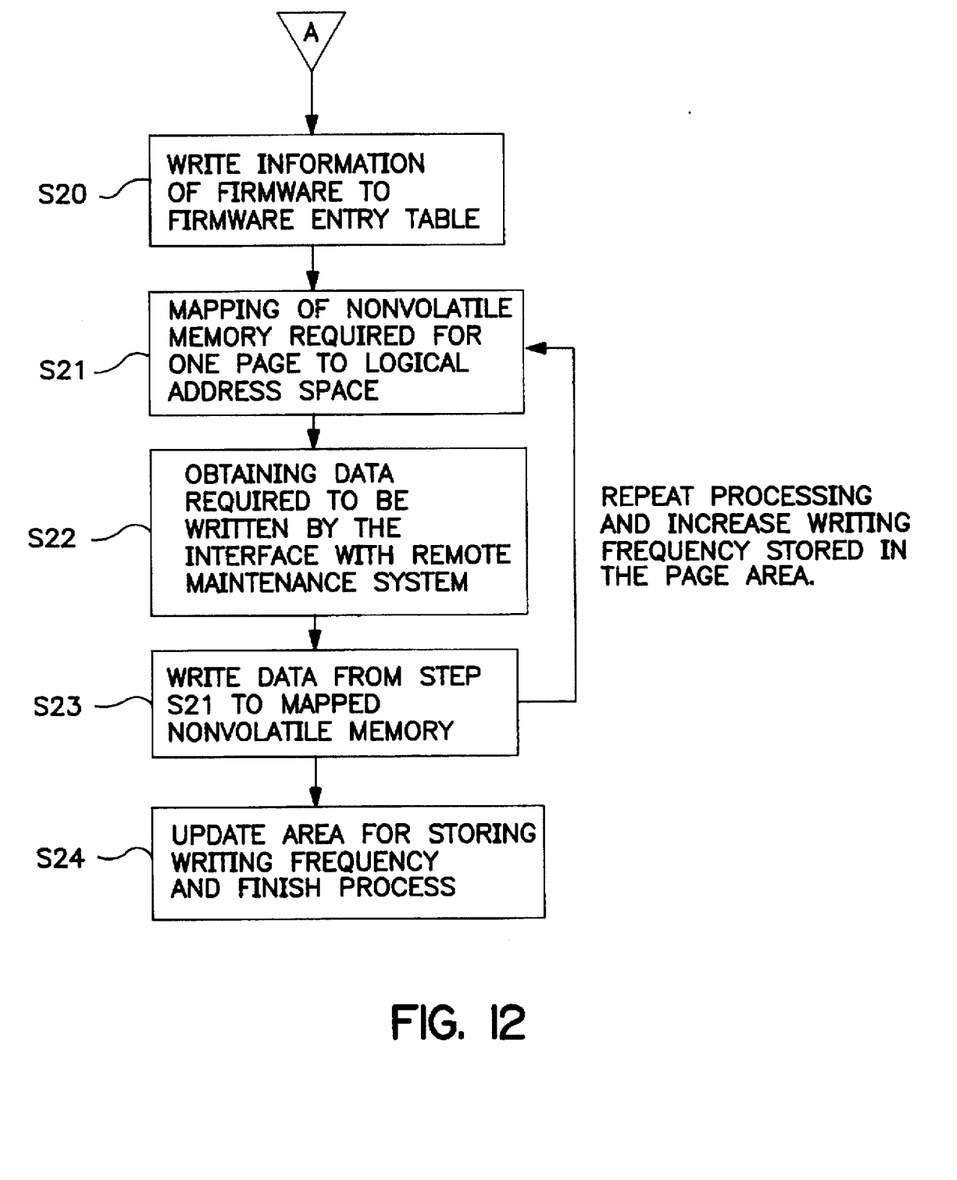
FIG. 12 is a second part of a diagram explaining the processing flow when writing to the non-volatile memory.

When the unused page is confirmed in STEP S18, it is linked to the processing of FIG. 12. More specifically, the information of the firmware which is stored at this time is written and updated to the firmware entry table (STEP S20).

Further, processing in STEPs S21–23 is repeated for the write data, and the firmware required to be stored in the unit of one page is stored into the non-volatile memory 14. Then, the write frequency stored in the page management area (see FIG. 9, 141(iii)) is increased.

Processing in STEPs S21–23 will now be explained individually. In STEP S21, the non-volatile memory 14 required for one page is mapped to the logical address space. The data of the firmware required to be written by the interface section 17 (see FIG. 1) with the central monitoring system 2 (see FIG. 1) located in the remote location is obtained in STEP S22. This data is written to the mapped non-volatile memory 14 (see FIG. 1) (STEP S23).

Then, the firmware entry area (141(ii)) is updated and the processing is finished (see FIG. 12, STEP S24). During this time, the mapping of the mapped non-volatile memory 14 is removed.

When the firmware of the old version is operated, it is possible to make an optional version operate, using information of the operational condition or the unoperational condition (see FIG. 9, the operation of flag 240) in the firmware entry table area (see FIG. 9, 141(ii)). This is accomplished according to a command from the central monitoring system 2 located in the remote location or the operation switch, in the station to be maintained 1, not shown in the diagram, and judging in STEP S4 of the operation flow shown in FIG. 10.

Further, in the above-described explanation of the embodiment, although the memory management unit (MMU) 13 is explained as an independent logical element, the present invention is not limited to the element. Moreover, it is also possible to improve the present invention by preforming the function as same as the above-described memory management unit (MMU) 13 by the microprocessor 11.

As explained, according to the present invention above, effectively keeping within the range for maintaining the write frequency of the non-volatile memory 14 and increasing reliability by using the management area as shown in FIGS. 8 and 9, is possible according to the present invention.

With the present invention, excessive RAMs in the hardware are not necessary. Further, since the apparatus structure maps only the page required for writing to the logical space of the microprocessor when writing to the non-volatile memory, reduction of the summary of the program or the breakdown of the system to a minimum so that higher reliability can be obtained, is possible.

What is claimed is:

1. A subordinate system connected to a central monitoring system via a communication network for storing firmware which is updated from the central monitoring system, the subordinate system comprising:

a microcomputer having logical addresses;

an EEPROM subdivided into a plurality of pages, including a management area to store a version number and a writing frequency of the management area, a firmware entry area to simultaneously store multiple versions of firmware formed by micro-programming from the central monitoring system wherein each of said multiple versions of firmware may be optionally read out from the firmware entry area, and a page management area to store a writing frequency for each of said plurality of pages;

a ROM to store management data indicating respective storing locations of each of said simultaneously stored firmware versions; and memory management means for converting the logical addresses of said microcomputer into physical addresses of said EEPROM, for transferring a firmware version as an undivided whole from the central monitoring system to said EEPROM, and for storing the transferred firmware version in said EEPROM, wherein said memory management means prohibits storage of the transferred firmware version into pages in which a writing frequency has exceeded a predetermined number and loads the transferred firmware version as a next firmware version upon restart of said microcomputer.

2. The subordinate system according to claim 1, wherein said memory management means converts physical addresses read out from said EEPROM into corresponding logical addresses.

3. The subordinate system according to claim 1, wherein said EEPROM records the number of writing times for each of the storing locations.

4. The subordinate system according to claim 1, wherein said memory management means only converts physical addresses to corresponding logical addresses for locations in said EEPROM in which data is written.

5. A subordinate system connected to a central monitoring system via a communication network for storing firmware which is updated from the central monitoring system, the subordinate system comprising:

a microcomputer having logical addresses;

a nonvolatile memory subdivided into a plurality of pages, including a management area to store a version number and a writing frequency of the management area, a firmware entry area to simultaneously store multiple versions of firmware formed by micro-programming from the central monitoring system wherein each of said multiple versions of firmware may be optionally read out from the firmware entry area, and a page management area to store a writing frequency for each of said plurality of pages; and memory management means for converting the logical addresses of said microcomputer into physical addresses of said EEPROM, for transferring a firmware version as an undivided whole from the central monitoring system to said EEPROM, and for storing the transferred firmware version in said EEPROM, wherein said memory management means prohibits storage of the transferred firmware version into pages in which a writing frequency has exceeded a predetermined number and loads the transferred firmware version as a next firmware version upon restart of said microcomputer.

6. A subordinate system according to claim 5, wherein said nonvolatile memory is an EEPROM, said subordinate system further comprising:

a ROM to store management data indicating respective storing locations of each of said simultaneously stored firmware versions within said EEPROM; and a RAM to store data during for program operation of said microcomputer.

7. A subordinate system to store updated firmware from a central monitoring system, comprising:

a microcomputer having logical addresses;

a nonvolatile memory subdivided into pages of physical addresses, including a first area to store an identification ID of a latest management area, a second area to simultaneously store multiple firmware versions, and a third area to store a writing frequency for each of said plurality of pages; and a memory manager to convert the logical addresses of said microcomputer into physical addresses of said nonvolatile memory and to transfer an undivided firmware version from the central monitoring system to said nonvolatile memory, wherein said memory manager prohibits storage of the transferred firmware version into pages of said nonvolatile memory which have exceeded a predetermined write frequency.

8. A subordinate system according to claim 7, wherein said nonvolatile memory is an EEPROM, said subordinate system further comprising:

a ROM to store management data indicating respective storing locations of each of said simultaneously stored firmware versions within said EEPROM; and a RAM to store data during program operation of said microcomputer.

9. A subordinate system to store updated firmware from a connected central monitoring system, comprising:

a microcomputer having logical addresses;

a nonvolatile memory subdivided into a plurality of pages, including a firmware entry area to simultaneously store multiple versions of firmware from the central monitoring system, and a page management area to store a writing frequency for each of said plurality of pages;

an interface section to receive an undivided firmware version from the central monitoring system; and memory management means to convert the logical addresses of said microcomputer into .physical addresses of said EEPROM and to transfer the undivided firmware version from said interface section to said nonvolatile memory, wherein said memory management means prohibits storage of the transferred firmware version into pages of said nonvolatile memory in which a writing frequency has exceeded a predetermined number.

10. A subordinate system according to claim 9, wherein said nonvolatile memory is an EEPROM, said subordinate system further comprising:

a ROM to store management data indicating respective storing locations of each of said simultaneously stored firmware versions within said EEPROM; and a RAM to store data during program operation of said microcomputer.

* * * * *